United States Patent [19]

Joerg

[11] Patent Number: 5,143,813
[45] Date of Patent: Sep. 1, 1992

[54] LIGHT-SENSITIVE PHOTOPOLYMERIZABLE AND DIAZONIUM SALT POLYCONDENSATION PRODUCT CONTAINING COMPOSITION AND RECORDING MATERIAL INCLUDING A MIXTURE OF BINDERS

[75] Inventor: Klaus Joerg, Ingelheim, Fed. Rep. of Germany

[73] Assignee: Hoechst Aktiengesellschaft, Frankfurt am Main, Fed. Rep. of Germany

[21] Appl. No.: 473,402

[22] Filed: Feb. 1, 1990

[30] Foreign Application Priority Data

Feb. 2, 1989 [DE] Fed. Rep. of Germany ....... 3903001

[51] Int. Cl.$^5$ .................. G03F 7/021; G03F 7/032; G03F 7/033
[52] U.S. Cl. ................................ 430/162; 430/157; 430/175; 430/176; 430/177; 430/275; 430/281; 430/286; 430/288
[58] Field of Search ............... 430/175, 176, 177, 281, 430/286, 288, 157, 162, 275

[56] References Cited

U.S. PATENT DOCUMENTS

| | | | |
|---|---|---|---|
| 4,171,974 | 10/1979 | Golda et al. | 96/75 |
| 4,289,838 | 9/1981 | Rowe et al. | 430/163 |
| 4,539,285 | 9/1985 | Duyal et al. | 430/157 |
| 4,659,645 | 4/1987 | Frommeld et al. | 430/175 |
| 4,707,437 | 11/1987 | Walls et al. | 430/176 |
| 4,851,319 | 7/1989 | Walls et al. | 430/176 |
| 5,045,429 | 9/1991 | Mack et al. | 430/175 |

FOREIGN PATENT DOCUMENTS

| | | |
|---|---|---|
| 1172492 | 8/1984 | Canada . |
| 0104863 | 4/1984 | European Pat. Off. . |
| 2044788 | 5/1983 | United Kingdom . |

Primary Examiner—Charles L. Bowers, Jr.
Assistant Examiner—Christopher G. Young
Attorney, Agent, or Firm—Foley & Lardner

[57] ABSTRACT

A light-sensitive mixture is described which contains a diazonium salt polycondensation product, a free-radical polymerizable compound having at least one terminal ethylenically unsaturated group and a boiling point at atmospheric pressure above 100° C., a polymerization initiator which forms free radicals under the action of actinic radiation, and, as a first binder, a water-insoluble reaction product which is soluble in organic solvents and in aqueous alkaline solutions, which is a reaction product of an intramolecular anhydride of an organic polycarboxylic acid with a hydroxyl-containing synthetic polymer, and which has no further functional groups capable of reacting with acid anhydrides, and, as a further binder, an acid organic polymer having an acid number above 70, preferably a (meth)acrylic acid copolymer. The mixture is useful for producing planographic printing plates which give long print runs, and is notable for a long shelf life at elevated temperature.

18 Claims, No Drawings

LIGHT-SENSITIVE PHOTOPOLYMERIZABLE AND DIAZONIUM SALT POLYCONDENSATION PRODUCT CONTAINING COMPOSITION AND RECORDING MATERIAL INCLUDING A MIXTURE OF BINDERS

BACKGROUND OF THE INVENTION

The invention relates to a negative working light-sensitive mixture which comprises a diazonium salt condensation product, a polymerizable compound, a photoinitiator and a polymeric binder, and to a recording material prepared therewith which is preferably suitable for preparing planographic printing plates.

Combinations of photopolymerizable mixtures with negative working diazo compounds, in particular diazonium salt polycondensation products, are known from DE-A-2,361,931, DE-A-2,903,270 and DE-A-3,007,212 (=GB-A-2,044,788). Therein either the diazo compound itself acts as a photoinitiator for the polymerization of the monomer, or an additional photoinitiator is added. The advantage is said to be in particular the improved resolution of the copy compared with pure photopolymerizable layers and the increased print run compared with layers which contain only diazo compounds as light-sensitive substances. Moreover, in certain cases it is possible to carry out the development with aqueous solutions or even with pure water.

A similar mixture which contains a binder having cross-linkable allyl side groups is described in EP-A-104,863. The advantage of the mixtures described therein is said to be in particular that the light sensitivity of the recording materials prepared therewith has a reduced temperature dependence. A further advantage is said to be the reduced dependence of the light sensitivity on the time gap between exposure and development. Offset printing plates which have been prepared from these light-sensitive mixtures, however, have the disadvantage of a relatively low run stability and an undesirably high dot gain during printing.

EP-A-167,963 describes a light-sensitive mixture of the above-mentioned constituents which contains as diazonium salt condensation product a polycondensation product units A-N₂X and B which are linked by intermediate members, preferably methylene groups, A being the radical of an aromatic diazonium compound which is condensable with formaldehyde and B being the radical of a compound which is likewise condensable with formaldehyde but which is free of diazonium groups, in particular the radical of an aromatic amine, of a phenol, or phenol ether, of an aromatic thioether, of an aromatic hydrocarbon, of an aromatic heterocycle compound or of an organic acid amide. The mixture produces long-run printing plates if it contains a water-insoluble binder. In this case, it requires the addition of organic solvents to the developer.

EP-A-211,391 describes a similar mixture which contains as binder the reaction product of a di- or tricarboxylic anhydride with a polymeric organic compound which contains free hydroxyl groups. The printing plates obtained therewith are developable in aqueous solutions without a major concentration of organic solvents and likewise produce long runs. The light-sensitive layers formed from this mixture, however, are tacky at elevated temperature and therefore must be provided with a non-tacky cover layer, for example a cover layer of polyvinyl alcohol. This layer, which acts as a barrier layer to atmospheric oxygen, likewise improves the curing of the light-sensitive layer. However, the cover layer does impair the developability, so that development takes distinctly longer. This is particularly noticeable following prolonged storage or storage at elevated temperature.

SUMMARY OF THE INVENTION

Accordingly, it is an object of the present invention to provide a negative working light-sensitive mixture which produces planographic printing plates having non-tacky surfaces even at elevated temperature.

Another object of the present invention is to provide a negative working light -sensitive mixture having properties which change little on prolonged or less than optimal storage, and which is processable into printing plates which give long printing runs.

Yet another object of the present invention is to provide a recording material comprising the foregoing improved negative working light-sensitive mixture.

In accomplishing the foregoing objectives, there has been provided, in accordance with one aspect of the present invention, a light-sensitive mixture comprising:

a) a diazonium salt polycondensation product, b) a free-radical polymerizable compound having at least one terminal ethylenically unsaturated group and a boiling point at atmospheric pressure above 100° C., c) a polymerization initiator which forms free radicals under the action of actinic radiation, d) as a binder, a reaction product of an intramolecular anhydride of an organic polycarboxylic acid with a hydroxyl-containing synthetic polymer which has no further functional groups capable of reacting with acid anhydrides, which is insoluble in water and soluble in organic solvents and in aqueous alkaline solutions, and e) as a further binder, an acid organic polymer having an acid number above about 70.

In accordance with another aspect of the present invention there is provided a light-sensitive recording material, in particular for the preparation of planographic printing plates, comprising a base material and, applied thereto, a light-sensitive layer which comprises the foregoing light-sensitive mixture.

Other objects, features and advantages of the present invention will become apparent to those skilled in the art from the following detailed description. It should be understood, however, that the detailed description and specific examples, while indicating preferred embodiments of the present invention, are given by way of illustration and not limitation. Many changes and modifications within the scope of the present invention may be made without departing from the spirit thereof, and the invention includes all such modifications.

DETAILED DESCRIPTION OF THE PREFERRED EMBODIMENTS

Suitable diazonium salt polycondensation products are condensation products of condensable aromatic diazonium salts, for example of diphenylamine-4-diazonium salts, with aldehydes, preferably formaldehyde. It is particularly advantageous to use cocondensation products which, in addition to the diazonium salt unit, also contain other, non-light-sensitive units which are derived from condensable compounds, in particular aromatic amines, phenols, phenol ethers, aromatic thioethers, aromatic hydrocarbons, aromatic heterocycles and organic acid amides. These condensation products are described in DE-C-2,024,244. In general, any diazonium salt polycondensation product described in DE-A-2,739,774 is suitable.

The diazonium salt units A—N$_2$X are preferably derived from compounds of the formula (R$^1$—R$^2$—)$_p$-R$^3$—N$_2$X, where X denotes the anion of the diazonium compound,
p denotes a whole number from 1 to 3,
R$^1$ denotes an aromatic radical having at least one position capable of condensation with an active carbonyl compound,
R$^3$ denotes a phenylene group,
R$^2$ denotes a single bond or one of the groups:

—(CH$_2$)$_q$—NR$^4$—,

—O—(CH$_2$)$_r$—NR$^4$—,

—S—(CH$_2$)$_r$—NR$^4$—,

—S—CH$_2$CO—NR$^4$—,

O—R$^5$—O—,

—O—

—S —or

—CO—NR$^4$— in which
q is a number from 0 to 5,
r is a number from 2 to 5,
R$^4$ is hydrogen, an alkyl group of 1 to 5 carbon atoms, an aralkyl group of 7 to 12 carbon atoms or an aryl group of 6 to 12 carbon atoms, and
R$^5$ is an arylene group of 6 to 12 carbon atoms.

Of the classes of compounds mentioned, preference is given to the condensation products of the diphenylamine-4-diazonium salts, which may be substituted by alkyl groups, alkoxy groups or halogen atoms. The preferred second components B are the optionally substituted diphenyl ethers, diphenyl sulfides, diphenylmethanes or diphenyls. For the condensation it is particularly advantageous to use the bis-methoxymethyl, bis-hydroxymethyl or bis-acetoxymethyl derivatives of the basic structures. The condensation product can contain on average about 0.1 to 50, preferably 0.2 to 20, units of B per unit of A-N$_2$X.

The amount of diazonium salt polycondensation product in the mixture is in general between about 5 and 60, preferably between 10 and 40, % by weight, based on the total amount of nonvolatile constituents.

Further particularly advantageous polycondensation products are obtained when an optionally substituted diphenylaminediazonium salt is condensed first with an aromatic compound R'—O—CH$_2$—BH and then with an aromatic compound R'—O—CH$_2$—B—CH$_2$—O—R', where R' is a hydrogen atom or an alkyl or aliphatic acyl radical. These condensation products are described in EP-A-126,875.

The free radical polymerizable compounds used are preferably acrylic or methacrylic acid esters of polyhydric, in particular primary, alcohols. The alcohols can contain 1 to 6, preferably 2 to 4, OH groups. Examples of suitable esters are trimethylolpropane triacrylate, pentaerythritol triacrylate and tetraacrylate, dipentaerythritol hexamethacrylate, propylene glycol dimethacrylate, glycerol dimethacrylate, triethylene glycol dimethacrylate, polyethylene glycol diacrylate and bisacrylates of oxyethylated bisphenol-A derivatives. Also suitable are the low molecular weight, urethane-group-containing acrylates and methacrylates which are obtained by reacting hydroxyalkyl acrylate or methacrylate with diisocyanates or polyisocyanates. The isocyanates can in turn have been obtained by reacting diisocyanates with diols or triols to give oligomeric compounds. The amount of polymerizable compounds is in general between about 10 and 65, preferably 30 to 60, % by weight.

The photoinitiators used can be a large number of compounds, including where appropriate mixtures of two or more different, frequently synergistically acting compounds. Examples are benzoin and its derivatives, polynuclear quinones, acridine derivatives, phenazine derivatives, aromatically substituted oxadiazoles, for example 2,5-bis(4-diethlamino-phenyl)-1,3,4-oxadiazole, benzil dimethyl ketal, aromatically substituted bis-trichloromethyl-s-triazines or trichloromethyl-substituted carbonylmethylene heterocycles, for example 2-(p-trichloromethyl-benzoylmethylene)-3-ethyl-benzothiazoline. The trichloromethyl compounds are particularly preferred. The amount of photoinitiator is in general between about 0.05 and 0, preferably between 0.5 and 5% by weight.

The polymeric reaction products (d) contained in the mixture according to the invention are described in EP-A-211,391 and EP-A-152,819. The acid anhydride used for preparing these products is preferably derived from a dicarboxylic or tricarboxylic acid, in particular a dicarboxylic acid.

Examples of suitable acid anhydrides are:
maleic anhydride and derivatives, for example dimethylmaleic anhydride or citraconic anhydride; succinic anhydride and derivatives, for example methylsuccinic anhydride; glutaric anhydride and derivatives, for example, 3-methylglutaric anhydride, 3,3-tetramethyleneglutaric anhydride or camphoric anhydride; 3-oxaglutaric anhydride and derivatives; phthalic anhydride and substitution products, for example, chloro-, nitro- or carboxy-phthalic anhydride; partially or completely hydrogenated phthalic anhydrides, for example hexahydrophthalic anhydride or cyclohexene-1,2-dicarboxylic anhydride; naphthaline-2,3-dicarboxylic anhydride or naphthaline-1,8-dicarboxylic anhydride and substitution products thereof; pyridine-o-dicarboxylic anhydride and its substitution products; pyrazine-o-dicarboxylic anhydride and its substitution products; furan-o-dicarboxylic anhydride or furan-2,5-dicarboxylic anhydride, their substitution products and their partially or completely hydrogenated derivatives; thiophene-o-dicarboxylic anhydride or thiophene-2,5-dicarboxylic anhydride, their substitution products and their completely or partially hydrogenated derivatives; dicyclic or polycyclic anhydrides which are formed by Diels-Alder reaction of a diene with maleic anhydride, for example the addition products of furan, anthracene, cyclohexa-1,3-diene or cyclopentadiene and maleic anhydride.

Preference is given to the reaction products with maleic, phthalic, succinic and 3-oxa-glutaric anhydride.

Suitable hydroxyl-containing synthetic polymers are in particular polymers having vinyl alcohol units, or even epoxy resins and hydrolyzed epoxy resins, copolymers of allyl alcohol or higher unsaturated alcohols, polyhydroxyalkyl acrylates and methacrylates and similar polymers.

Suitable polymers with vinyl alcohol units are partially hydrolyzed polyvinyl esters, polyvinyl acetals having free hydroxyl groups and corresponding reaction products of copolymers or copolymerization products with vinyl ester or vinyl acetal or vinyl alcohol units.

The molecular weight of the polymeric reaction products can vary within wide ranges. In general, products having average molecular weights between about 5,000 and 200,000 or more preferably between 10,000 and 100,000, are used. The acid number of the reaction products can be in general between about 5 and 80, preferably between 10 and 70.

The further binder (e) is an acid polymer which is more soluble in weakly alkaline aqueous solutions than the polymeric reaction product (d). It may contain, for example, one of the groups -COOH, $-PO_3H_2$, $-SO_3H$, $-SO_2-NH-$, $-SO_2NHSO-$,- and -SO,NHCO-, of which carboxyl groups are preferred. Its acid number is not less than about 70, preferably from 100 to 300. Examples of suitable polymers are maleate resins, polymers and copolymers of β-(methacryloyloxy)ethyl N-(p-tolylsulfonyl)carbamate, vinyl acetate/crotonic acid and styrene/maleic anhydride or styrene/maleic partial ester copolymers. It is particularly advantageous to use copolymers of acrylic and methacrylic acid. Suitable comonomers are preferably alkyl (meth)acrylates, styrene, acrylonitrile, and the like. The copolymers can be formed from two or more monomers. Such copolymers are described in DE-C-2,064,080, DE-A-2,363,806 and EP-A-173,057.

The proportion of polymers (e) is in general from about 1 to 25, preferably from 4 to 15, % by weight, based on the nonvolatile constituents of the light-sensitive mixture. The weight ratio of (d):(e) is preferably between about 95:5 and 50:50. The total amount of binder in the mixture is in general from about 5 to 80, preferably 10 to 50, % by weight, based on the nonvolatile constituents of the mixture.

The mixtures according to the invention can further contain acids, inhibitors for the thermopolymerization, dyes, pigments, flow control agents, plasticizers, wetting agents and other customary additives.

The mixtures are preferably used for preparing light-sensitive printing plates, in particular planographic printing plates. In this case the base materials used are predominantly metals, such as zinc, steel, chromed steel, brass/chromium, copper/chromium or aluminum. In the case of planographic printing plates it is preferred to use aluminum, in particular mechanically, chemically or electrolytically roughened aluminum which is preferably additionally provided with an anodically generated oxide layer.

The mixtures can also be used in photoresist technology, for example for preparing letterpress, intaglio or multi-metal printing plates, or printed circuits. In this use, it is in many cases an increased resolution, compared with the photopolymerizable mixtures otherwise used, which is of particular advantage.

In all uses, the advantages of the mixtures according to the invention over the known mixtures based on photopolymer/diazonium salt condensate are shown off in terms of increased light sensitivity, increased storability and improved adhesion of the light-sensitive layer, in particular in the exposed state.

A particular surprise is the improvement in the developability following the prolonged storage or storage at elevated temperature. It has been found that this advantage cannot simply be achieved by increasing the acid number of the polymer (d). On the contrary, the above-described very specific combination of binders is necessary.

The solvents used for preparing the coating solutions can be, depending on the layer constituents, alcohols, such as methanol and ethanol; glycol ethers such as ethylene glycol monoethyl ether, propylene glycol monomethyl ether; dimethylformamide and diethylformamide; ethers such as dioxane, tetrahydrofuran; esters such as ethyl acetate, butyl acetate, ethylene glycol methyl ether acetate; ketones such as methyl ethyl ketone, cyclohexanone and the like.

The light-sensitive layer can be generated in conventional manner by applying the solution of its constituents to the base material. It can first be applied to a temporary base material from which it is mechanically separable and can be transferred by laminating to the final base material, for example a nickel foil or the copper layer of a printed circuit board base material.

In the course of processing, the recording material is exposed imagewise through a master. The image exposure light source used can be any light source which is customary in reproduction technology and which emits in the long-wave UV region, for example carbon arc lamps, mercury high pressure lamps, xenon pulsed lamps and others. Electron and laser radiation are also suitable for image recording. Following irradiation, the layer can be additionally cured in the image areas by heating to temperatures above 60° C.

The light-sensitive layer can be covered with a cover layer which is less permeable to oxygen and which is preferably water-soluble. Suitable transparent water-soluble polymers for preparing this layer are for example polyvinyl alcohol and polyvinylpyrrolidone, to each of which surfactants or acids may be added. The addition of acids, in particular mineral acids, e.g. phosphoric or sulfuric acid, additionally increases the storability of the material. The amount of acid can be about 5–50% by weight, based on the weight of the cover layer. The cover layer preferably has a weight of from about 0.2 to 3 $g/m^2$ after drying.

The exposure is followed by development with a suitable developer. The developers used can be, for example, aqueous wetting agent solutions, in the presence or absence of alkali, their mixtures with organic solvents, aqueous salt solutions, aqueous solutions of acids, for example of phosphoric acids, to which in turn salts or organic solvents can be added, or aqueous-alkaline developers, for example aqueous solutions of sodium salts of phosphoric acid or of silicic acid. These developers can likewise be admixed with organic solvents. It is in some cases also possible to use water-diluted organic solvents. The developers can additionally contain further constituents, for example, wetting agents and hydrophilizing agents.

Development is effected in the known way, for example by dipping and/or wiping or spraying with the developer fluid, in the course of which the nonexposed areas of the layer are dissolved.

The developed printing plate can also additionally be postcured by heating to a temperature within the range of 150°–230° C. In general a time of about 2 to 20 minutes is sufficient for the postcure. A further possibility is postcuring through exposure or irradiation of the developed printing form. This type of aftertreatment is significantly more effective in the case of a printing plate composed of the mixture according to the invention than in the case of a plate whose light-sensitive layer only comprises a photopolymerizable mixture. Since the printing plate according to the present invention is less sensitive to atmospheric oxygen than a pure photopolymer plate, it can also be cured by radiation without an oxygen-damming top layer, i.e. in the presence of atmospheric oxygen.

The examples below describe the preparation of the light-sensitive mixtures according to the invention and of the recording materials prepared therewith. In the examples, parts by weight (pbw) and parts by volume (pbv) relate to one another as the g relates to the ml. Percentages are, unless otherwise stated, by weight, and temperatures are given in .C.

EXAMPLE 1 a) An aluminum sheet was electrochemically roughened and anodized and subsequently, to improve the hydrophilic character, treated with an aqueous solution of polyvinylphosphonic acid. This was followed by application of the following mixture in such an amount to produce a dry weight of 1.8 g/m$^2$:

- 0.450 pbw of a copolymer of 82% of methyl methacrylate and 18% of methacrylic acid (acid number 117),
- 1.050 pbw of the reaction product of a polyvinyl butyral having a molecular weight of 70,000–80,000, which contained 71% by weight of vinylbutyral, 2% by weight of vinyl acetate and 27% by weight of vinyl alcohol units, with maleic anhydride (acid number of the product 30),
- 0.450 pbw of a diazonium salt polycondensation product of 1 mol of 3-methoxydiphenylamine-4-diazonium-sulfate and 1 mol of 4,4'-bis-methoxymethyl-diphenyl ether, precipitated as mesitylene sulfonate,
- 0.090 pbw of Victoria Pure Blue FGA (C.I. Basic Blue 81),
- 1.500 pbw pentaerythritol tetraacrylate/triacrylate (technical grade mixture),
- 0.120 pbw of 2-(4-styryl-phenyl)-4,6-bis-trichloromethyl-s-triazine and
- 0.040 pbw of phosphoric acid (85%) and
- 0.007 pbw of phenylazodiphenylamine in
- 47.700 pbw of 2-methoxyethanol and
- 48.600 pbw of butanone.

This layer was coated with a 2% strength aqueous solution of polyvinyl alcohol (12% of residual acetate groups, K value 4) which additionally contained 0.6% of phosphoric acid. The printing plates thus obtained were tested for developability following storage at elevated temperature by storing them at 100° C. in a through-circulation cabinet for one to four hours and then irradiating them under a test original, treating them with the following developer consisting of:

- 3.00 pbw of sodium dodecylsulfate,
- 5.40 pbw of potassium pelargonate
- 4.00 pbw of phenoxyethanol,
- 2.00 pbw of potassium tetraborate ×4H$_2$O,
- 85.50 pbw of water and developing them by rubbing with a graphic pad. Irradiation times and development times for a sample 20×10 cm in size after less than optimal storage are summarized in Table 1.

The mixture of pentaerythritol tetraacrylate and triacrylate was replaced in each case by identical amounts of trimethylolpropane triethoxytriacrylate, hexanediol diacrylate, tripropylene glycol diacrylate, N,N'-methylenebisacrylamide or the reaction product of two mol of hydroxyethyl methacrylate and one mol of trimethylhexamethylene diisocyanate. The development times for the plate samples following storage at 100° C. are all within the same range as in the case of the above-specified monomer mixture.

b) In a further test, the above-specified coating solution was applied at such an amount that drying left a layer weight of 2.7 g/m, The plate was stored, irradiated and developed, all three steps being carried out as described above. The development times are summarized in Table 1.

Comparative Example 1

Printing plate conforming to .DE-A-3,528,309: A solution of

- 1.500 pbw of the reaction product of the polyvinyl butyral indicated in Example 1,
- 0.450 pbw of the diazonium salt polycondensation product indicated in Example 1,
- 0.090 pbw of Victoria Pure Blue FGA (C.I. Basic Blue 81),
- 1.500 pbw of pentaerythritol tetraacrylate/-triacrylate (technical grade mixture),
- 0.120 pbw of 2-(4-styrylphenyl)-4,6-bis-trichloromethyl-s-triazine,
- 0.040 pbw of 85% strength phosphoric acid and
- 0.007 pbw of phenylazodiphenylamine in
- 47.700 pbw of 2-methoxyethanol and
- 48.600 pbw of butanone was applied in a dry layer weight of 1.8 g/m, to an aluminum sheet pretreated as described in Example 1, and coated with the above-described oxygen barrier layer. Samples of this printing plate were subjected to storage at 100° C. as described in Example 1. Thereafter the plates were irradiated and developed with the developer solution indicated in Example 1. The development times (manual development) for the samples 20×10 cm in size are listed in Table 1.

Comparative Example 2

For comparison, a printing plate conforming to DE-A-3,528,309 was produced; however, a binder of a higher acid number was employed.

A solution of

- 1.500 pbw of the reaction product of a polyvinyl butyral as in Example 1 except with an acid number of 64,
- 0.450 pbw of the diazonium salt polycondensation product indicated in Example 1,
- 0.090 pbw of Victoria Pure Blue FGA (C.I. Basic Blue 81),
- 1.500 pbw of pentaerythritol tetraacrylate/-triacrylate (technical grade mixture),
- 0.120 pbw of 2-(4-styrylphenyl)-4,6-bis-tri-chloromethyl-s-triazine,
- 0.040 pbw of 85% strength phosphoric acid and
- 0.007 pbw of phenylazodiphenylamine in
- 47.700 pbw of 2-methoxyethanol and
- 48.600 pbw of butanone was applied in a dry layer weight of 1.8 g/m$^2$ to an aluminum sheet pretreated as described in Example 1, and coated with the above-desired oxygen barrier layer. Samples of this printing plate were subjected to storage at 100° C. as described in Example 1. Thereafter the plates were irradiated and developed with the developer solution indicated in Example 1. The development times (manual development) for the samples 20×10 cm in size are listed in Table 1.

EXAMPLE 2

A solution of
0.600 pbw of the copolymer indicated in Example 1,
0.900 pbw of the reaction product indicated in Example 1,
0.450 pbw of the diazonium salt polycondensation product indicated in Example 1,
0.090 pbw of Victoria Pure Blue FGA (C.I. Basic Blue 81),
1.500 pbw of pentaerythritol tetraacrylate/-triacrylate (technical grade mixture),
0.120 pbw of 2-(4-styrylphenyl)-4,6-bis-trichloromethyl-s-triazine,
0.040 pbw of 85% strength phosphoric acid and
0.007 pbw of phenylazodiphenylamine in
47.700 pbw of 2-methoxyethanol and
48.600 pbw of butanone
was applied in a dry layer weight of 1.8 g/m$^2$ to an aluminum sheet pretreated as described in Example 1, and coated with the above-described oxygen barrier layer. Samples of this printing plate were subjected to storage of 100° C. as described in Example 1. Thereafter the plates were irradiated and developed with the developer solution indicated in Example 1. The development times (manual development) for the samples 20×10 cm in size are listed in Table 1.

EXAMPLE 3

A solution of
0.450 pbw of the copolymer indicated in Example 1,
1.050 pbw of the reaction product indicated in Example 1,
0.540 pbw of the diazonium salt polycondensation product indicated in Example 1,
0.090 pbw of Victoria Pure Blue FGA (C.I. Basic Blue 81),
1.500 pbw of pentaerythritol tetraacrylate/-triacrylate (technical grade mixture),
0.120 pbw of 2-(4-styrylphenyl)-4,6-bis-tri-chloromethyl-s-triazine,
0.040 pbw of 85% strength phosphoric acid and
0.007 pbw of phenylazodiphenylamine in
47.700 pbw of 2-methoxyethanol and
48.600 pbw of butanone
was applied in a dry layer weight of 1.8 g/m$^2$ to an aluminum sheet pretreated as described in Example 1, and coated with the above-described oxygen barrier layer. Samples of this printing plate were subjected to storage at 100° C. as described in Example 1. Thereafter the plates were irradiated and developed with the developer solution indicated in Example 1. The development times (manual development) for the samples 20×10 cm in size are listed in Table 1.

EXAMPLE 4

A solution of
0.450 pbw of the copolymer indicated in Example 1,
1.050 pbw of the reaction product indicated in Example 1,
0.450 pbw of the diazonium salt polycondensation product indicated in Example 1,
0.090 pbw of Victoria Pure Blue FGA (C.I. Basic Blue 81),
1.500 pbw of trimethyloethane triacrylate,
0.120 pbw of 2-(4-styrylphenyl)-4,6-bis-tirchloromethyl-s-triazine,
0.040 pbw of 85% strength phosphoric acid and
0.007 pbw of phenylazodiphenylamine in
47.700 pbw of 2-methoxyethanol and
48.600 pbw of butanone
was applied in a dry layer weight of 1.8 g/m$^2$ to an aluminum sheet pretreated as described in Example 1, and coated with the above-described oxygen barrier layer. Samples of this printing plate were subjected to storage at 100° C. as described in Example 1. Thereafter the plates were irradiated and developed with the developer solution indicated in Example 1. The development times (manual development) for the samples 20×10 cm in size are listed in Table 1.

EXAMPLE 5

A solution of
0.450 pbw of the copolymer indicated in Example 1,
1.050 pbw of the reaction product of the polyvinyl butyral indicated in Example 1 with succinic anhydride (acid number of the product: 64),
0.500 pbw of the diazonium salt polycondensation product indicated in Example 1,
0.090 pbw of Victoria Pure Blue FGA (C.I. Basic Blue 81),
1.500 pbw of pentaerythritol tetraacrylate/-triacrylate (technical grade mixture),
0.120 pbw of 2-(4-styrylphenyl)-4,6-bis-trichloromethyl-s-triazine,
0.040 pbw of 85% strength phosphoric acid and
0.007 pbw of phenylazodiphenylamine in
47.700 pbw of 2-methoxyethanol and
48.600 pbw of butanone
was applied in a dry layer weight of 1.8 g/m, to an aluminum sheet pretreated as described in Example 1, and coated with the above-described oxygen barrier layer. Samples of this printing plate were subjected to storage at 100° C. as described in Example 1. Thereafter the plates were irradiated and developed with the developer solution indicated in Example 1. The development times (manual development) for the samples 20×10 cm in size are listed in Table 1.

EXAMPLE 6

A solution of
0.450 pbw of the copolymer indicated in Example 1,
1.050 pbw of the reaction product indicated in Example 1,
0.540 pbw of the diazonium salt polycondensation product indicated in Example 1,
0.090 pbw of Victoria Pure Blue FGA (C.I. Basic Blue 81),
1.500 pbw of pentaerythritol tetraacrylate/-triacrylate (technical grade mixture),
0.120 pbw of 2-(4-styrylphenyl)-4,6-bis-trichloromethyl-s-triazine,
0.040 pbw of 85% strength phosphoric acid and
0.007 pbw of phenylazodiphenylamine in
47.700 pbw of 2-methoxyethanol and
48.600 pbw of butanone
was applied in a dry layer weight of 1.8 g/m, to an aluminum sheet pretreated as described in Example 1, and coated with the above-described oxygen barrier layer. Samples of this printing plate were subjected to storage at 100° C. as described in Example 1. Thereafter the plates were irradiated and developed with the developer solution indicated in Example 1. The development times (manual development) for the samples 20×10 cm in size are listed in Table 1.

Comparative Example 3

A solution of
1.500 pbw of the reaction product indicated in Example 5,
0.500 pbw of the diazonium salt polycondensation product indicated in Example 1,
0.090 pbw of Victoria Pure Blue FGA (C.I. Basic Blue 81),
1.500 pbw of pentaerythritol tetraacrylate/-triacrylate (technical grade mixture),
0.120 pbw of 2-(4-styrylphenyl)-4,6-bis-trichloromethyl-s-triazine,
0.040 pbw of 85% strength phosphoric acid and
0.007 pbw of phenylazodiphenylamine in
47.700 pbw of 2-methoxyethanol and
48.600 pbw of butanone
was applied in a dry layer weight of 1.8 g/m$^2$ to an aluminum sheet pretreated as described in Example 1, and coated with the above-described oxygen barrier layer. Samples of this printing plate were subjected to storage at 100° C. as described in Example 1. Thereafter the plates were irradiated and developed with the developer solution indicated in Example 1. The development times (manual development) for the samples 20×10 cm in size are listed in Table 1.

EXAMPLE 7

A solution of
0.450 pbw of the copolymer of styrene and maleic anhydride (1:1) in which some of the anhydride groups have been reacted with n-butanol (acid number 185),
1.050 pbw of the reaction product indicated in Example 1,
0.450 pbw of the diazonium salt polycondensation product indicated in Example 1,
0.090 pbw of Victoria Pure Blue FGA (C.I. Basic Blue 81),
1.500 pbw of pentaerythritol tetraacrylate/-triacrylate (technical grade mixture),
0.120 pbw of 2-(4-styrylphenyl)-4,6-bis-trichloromethyl-s-triazine,
0.040 pbw of 85% strength phosphoric acid and
0.007 pbw of phenylazodiphenylamine in
47.700 pbw of 2-methoxyethanol and
48.600 pbw of butanone
was applied in a dry layer weight of 1.8 g/m$^2$ to an aluminum sheet pretreated as described in Example 1, and coated with the above-described oxygen barrier layer Samples of this printing plate were subjected to storage at 100° C. as described in Example 1. Thereafter the plates ere irradiated and developed with the developer solution indicated in Example 1. The development times (manual development) for the samples 20×10 cm in size are listed in Table 1.

EXAMPLE 8

A solution of
0.450 pbw of the copolymer indicated in Example 1,
1.050 pbw of the reaction product indicated in Example 1,
0.450 pbw of the diazonium salt polycondensation product indicated in Example 1,
0.090 pbw of Victoria Pure Blue FGA (C.I. Basic Blue 81),
1.500 pbw of pentaerythritol tetraacrylate/-triacrylate (technical grade mixture),
0.120 pbw of 2,5-bis(4-diethylaminophenyl)-1,3,4-oxadiazole,
0.040 pbw of 85% strength phosphoric acid and
0.007 pbw of phenylazodiphenylamine in
47.700 pbw of 2-methoxyethanol and
48.600 pbw of butanone
was applied in a dryer layer weight of 1.8 g/m$^2$ to an aluminum sheet pretreated as described in Example 1, and coated with the above-described oxygen barrier layer. Samples of this printing plate were subjected to storage at 100° C. as described in Example 1. Thereafter the plates were irradiated and developed with the developer solution indicated in Example 1. The development times (manual development for the samples 20×10 cm in size are listed in Table 1.

EXAMPLE 9

A solution of
0.450 pbw of the copolymer indicated in Example 1,
1.050 pbw of the reaction product indicated in Example 1,
0.450 pbw of the diazonium salt polycondensation product indicated in Example 1 but precipitated as methanesulfonate,
0.090 pbw of Victoria Pure Blue FGA (C.I. Basic Blue 81),
1.500 pbw of pentaerythritol tetraacrylate/-triacrylate (technical grade mixture),
0.120 pbw of 2-(4-styrylphenyl)-4,6-bis-trichloromethyl-s-triazine,
0.040 pbw of 85% strength phosphoric acid and
0.007 pbw of phenylazodiphenylamine in
47.700 pbw of 2-methoxyethanol and
48.600 pbw of butanone
was applied in a dry layer weight of 1.8 g/m$^2$ to an aluminum sheet pretreated as described in Example 1, and coated with the above-described oxygen barrier layer. Samples of this printing plate were subjected to storage at 100° C. as described in Example 1. Thereafter the plates were irradiated and developed with the developer solution indicated in Example 1. The development times (manual development) for the samples 20×10 cm in size are listed in Table 1.

EXAMPLE 10

A solution of
0.450 pbw of the copolymer indicated in Example 1,
1.050 pbw of the reaction product indicated in Example 1,
0.450 pbw of the diazonium salt polycondensation product indicated in Example 1 but precipitated as 1-hydroxy-3-methoxybenzophenone-4-sulfonate,
0.090 pbw of Victoria Pure Blue FGA (C.I. Basic Blue 81),
1.500 pbw of pentaerythritol tetraacrylate/-triacrylate (technical grade mixture),
0.120 pbw of 2-(4-styrylphenyl)-4,6-bis-trichloromethyl-s-triazine,
0.040 pbw of 85% strength phosphoric acid and
0.007 pbw of phenylazodiphenylamine in
47.700 pbw of 2-methoxyethanol and
48.600 pbw of butanone
was applied in a dry layer weight of 1.8 g/m$^2$ to an aluminum sheet pretreated as described in Example 1, and coated with the above-described oxygen barrier layer. Samples of this printing plate were subjected to storage at 100° C. as described in Example 1. Thereafter the plates were irradiated and developed with the developer solution indicated in Example 1. The development times (manual development) for the samples 20×10 cm in size are listed in Table 1.

EXAMPLE 11

A solution of
0.150 pbw of the copolymer indicated in Example 1,
1.350 pbw of the reaction product indicated in Example 1,
0.450 pbw of the diazonium salt polycondensation product indicated in Example 1,
0.090 pbw of Victoria Pure Blue FGA (C.I. Basic Blue 81),
1.500 pbw of pentaerythritol tetraacrylate/-triacrylate (technical grade mixture),
0.120 pbw of 2-(4-styrylphenyl)-4,6-bis-trichloromethyl-s-triazine,
0.040 pbw of 85% strength phosphoric acid and
0.007 pbw of phenylazodiphenylamine in
47.700 pbw of 2-methoxyethanol and
48.600 pbw of butanone
was applied in a dry layer weight of 1.8 g/m, to an aluminum sheet pretreated as described in Example 1, and coated with the above-described oxygen barrier layer. Samples of this printing plate were subjected to storage at 100° C. as described in Example 1. Thereafter the plates were irradiated and developed with the developer solution indicated in Example 1. The development times (manual development) for the samples 20×10 cm in size are listed in Table 1.

Table 1

Development times for samples 20×10 cm in size following storage at 100° C. (all the samples were irradiated for 20 seconds, all times are given in seconds, C = comparative example)

| Example | Blank value | 1 h | 2 h | 3 h | 4 h |
| --- | --- | --- | --- | --- | --- |
| 1a | 5 | 10 | 14 | 20 | 23 |
| 1b | 8 | 12 | 17 | 22 | 28 |
| 2 | 5 | 10 | 16 | 18 | 22 |
| 3 | 6 | 10 | 12 | 20 | 27 |
| 4 | 6 | 9 | 15 | 15 | 25 |
| 5 | 5 | 6 | 7 | 10 | 20 |
| 6 | 5 | 7 | 9 | 13 | 20 |
| 7 | 6 | 9 | 10 | 17 | 28 |
| 8 | 6 | 9 | 14 | 17 | 21 |
| 9 | 7 | 12 | 14 | 20 | 25 |
| 10 | 6 | 8 | 8 | 12 | 12 |
| 11 | 6 | 11 | 12 | 22 | 25 |
| C1 | 7 | 13 | 17 | >45 | >45 |
| C2 | 7 | 10 | 16 | >45 | >45 |
| C3 | 7 | 7 | 15 | 30 | >45 |

What is claimed is:

1. A light-sensitive mixture comprising in admixture:
a) about 5 to 60% by weight of a diazonium salt polycondensation product comprising repeating units A—$N_2X$ and B which are bonded to one another through intermediate members which are derived from condensable carbonyl compounds, A being the radical of an aromatic diazonium compound which is condensable with formaldehyde and B being the radical of a compound which is free of diazonium groups and condensable with formaldehyde,
b) about 50 to 65% by weight of a free-radical-polymerizable compound having at least one terminal ethylenically unsaturated group and a boiling point at atmospheric pressure above 100° C.,
c) about 0.05 to 10% by weight of a polymerization initiator which forms free radicals under the action of actinic radiation,
d) as a binder, a reaction product of an intramolecular anhydride of an organic polycarboxylic acid with a hydroxyl-containing synthetic polymer which has no further functional groups capable of reacting with acid anhydrides, which is insoluble in water and soluble in organic solvents and in aqueous alkaline solutions, said binder having an acid number between about 10 and 70; and
e) as a further binder, about 5 to 50% by weight, based on the total amount of binder, of an acid organic polymer comprising carboxyl groups and having an acid number above about 70,
wherein the total weight percent of d) plus e) is about 5–80%.

2. A light sensitive mixture as claimed in claim 1, wherein said further binder has an acid number between about 100 and 300.

3. A light-sensitive mixture as claimed in claim 1, wherein said further binder (e) is an acrylic or methacrylic acid copolymer.

4. A light-sensitive mixture as claimed in claim 1, wherein said organic polycarboxylic acid is a dicarboxylic or tricarboxylic acid.

5. A light-sensitive mixture as claimed in claim 4, wherein said organic polycarboxylic acid is maleic acid, phthalic acid, succinic acid or 3-oxaglutaric acid.

6. A light-sensitive mixture as claimed in claim 1, wherein said hydroxyl-containing polymer is a polymer having vinyl alcohol units.

7. A light-sensitive mixture as claimed in claim 1, wherein said intermediate members comprise methylene groups.

8. A light-sensitive mixture as claimed in claim 1, wherein B is the radical of an aromatic amine, a phenol, a phenol ether, an aromatic thioether, an aromatic hydrocarbon, an aromatic heterocyclic compound or an organic acid amide.

9. A light-sensitive mixture as claimed in claim 1, wherein said diazonium salt polycondensation product contains about 0.1 to 50 units of B per unit of A-$N_2X$.

10. A light-sensitive mixture as claimed in claim 1, wherein said free radical polymerizable compound is an acrylic or methacrylic acid ester of a polyhydric alcohol.

11. A light-sensitive mixture as claimed in claim 10, wherein said polyhydric alcohol contains about 1 to 6 OH groups.

12. A light-sensitive mixture as claimed in claim 1, wherein said polymerization initiator is a compound having at least one photolytically cleavable trichloromethyl group.

13. A light-sensitive mixture as claimed in claim 1, wherein said further binder (e) is a copolymer of styrene and maleic anhydride or a copolymer of styrene and maleic partial ester copolymers.

14. A light-sensitive mixture as claimed in claim 3, wherein said copolymer comprises a monomer selected from the group consisting of alkyl (meth)acrylates, styrene, acrylonitrile, and mixtures thereof.

15. A light-sensitive mixture as claimed in claim 1, consisting essentially of the recited ingredients.

16. A light-sensitive recording material comprising a base material and, applied thereto, a light-sensitive layer which comprises a light-sensitive mixture as claimed in claim 1.

17. A light-sensitive recording material as claimed in claim 16, further comprising a cover layer which is relatively impermeable to oxygen.

18. A light sensitive recording material as claimed in claim 16, wherein said base material in a metal.

* * * * *

UNITED STATES PATENT AND TRADEMARK OFFICE
CERTIFICATE OF CORRECTION

PATENT NO. : 5,143,813
DATED : February 1, 1990
INVENTOR(S) : Klaus Joerg

It is certified that error appears in the above-indentified patent and that said Letters Patent is hereby corrected as shown below:

Column 13, Claim 1, line 65, "50 to 65% by weight" should read -- 10 to 65% by weight--.

Signed and Sealed this

Nineteenth Day of October, 1993

Attest:

BRUCE LEHMAN

*Attesting Officer*     *Commissioner of Patents and Trademarks*